United States Patent [19]

Mercer

[11] 4,363,933

[45] Dec. 14, 1982

[54] AUTOMATIC NAVIGATION STATION IDENTIFIER AND MONITOR

[76] Inventor: John E. Mercer, 23401 94th Ave. S., Kent, Wash. 98031

[21] Appl. No.: 206,059

[22] Filed: Nov. 10, 1980

[51] Int. Cl.³ .......................... H04N 5/44; H04B 1/00; H04B 17/00
[52] U.S. Cl. ..................................... 178/118; 455/226
[58] Field of Search .................... 375/10; 455/226; 340/171 A, 171 PF, 825.73, 825.75; 358/194; 178/89, 118

[56] References Cited

U.S. PATENT DOCUMENTS 3,771,059 11/1973 Butler et al. ........................... 375/10
4,047,227 9/1977 Rzeszewski .................... 340/171 A
4,227,255 10/1980 Carrick et al. ...................... 455/226

Primary Examiner—Thomas A. Robinson
Attorney, Agent, or Firm—Delbert J. Barnard; Eugene O. Heberer; Joan H. Pauly

[57] ABSTRACT

This invention relates to a method and apparatus for automatically decoding and monitoring Morse code identifying call letters of radio navigation aids commonly in use for both aircraft and marine transportation, e.g. VOR—very high frequency omni range, ILS—instrument landing system, NDB—non directional beacons, and DME—distance measurement equipment.

16 Claims, 3 Drawing Figures

AUTOMATIC NAVIGATION STATION IDENTIFIER AND MONITOR

BACKGROUND OF THE INVENTION

The identifying call letters of the various radio navigational aids used in aircraft and marine transportation are transmitted by means of tone modulated Morse code. These identifying code groups are transmitted at a speed of approximately seven words per minute with a repetition rate of between two and twenty times per minute as allowed by the International Civil Aviation Organization (ICAO) Aeronautical Telecommunications, Annex 10.

The prior state of the art required that the pilot or crew member listen to and identify the Morse code dots and dashes while concurrently performing other piloting functions as well. Often the signal received by the navigation equipment is very noisy causing many pilots to neglect this very important identification task altogether. Such inadequate piloting procedures have been cited by the National Transportation and Safety Board (NTSB) as a contributing factor in several aircraft accidents.

SUMMARY OF THE INVENTION

This invention relates to a method and apparatus for the automatic detection and monitoring of the identifying Morse code call letters of various radio navigational aids. The particular embodiment of the invention that is disclosed herein is intended for aircraft use although the design is equally appropriate for marine or any other mode of transportation utilizing radio navigational aids.

It is the intent of this invention to free the pilot from learning and listening to the Morse code, enabling him to concentrate on other important tasks.

It is also the object of this invention to provide a continuous means of monitoring that the correct station has been selected and is operational. This latter point is of particular importance since it is required by ICAO standards only that the radio navigation facility cease transmitting the station identifier if something is wrong with the navigation signal. Also during periods of maintenance or adjustment it is the only means of alerting the pilot that the navigational information he is receiving may be unreliable.

Another intent of the invention is to serve as a subcomponent of a larger navigational system. Such a system might employ an electronically tuned receiver which would automatically scan through all of the radio navigation channels with the aforementioned invention providing automatic station identification and monitoring. This information could in turn be automatically supplied to a central navigation computer which could supply the pilot with desired information such as latitute, longitude, desired heading, time and distance to destination, etc.

Other objects and advantages will become apparent from the following description taken in conjunction with the accompanying drawings in which:

DESCRIPTION OF THE PREFERRED EMBODIMENT

Figure 1:
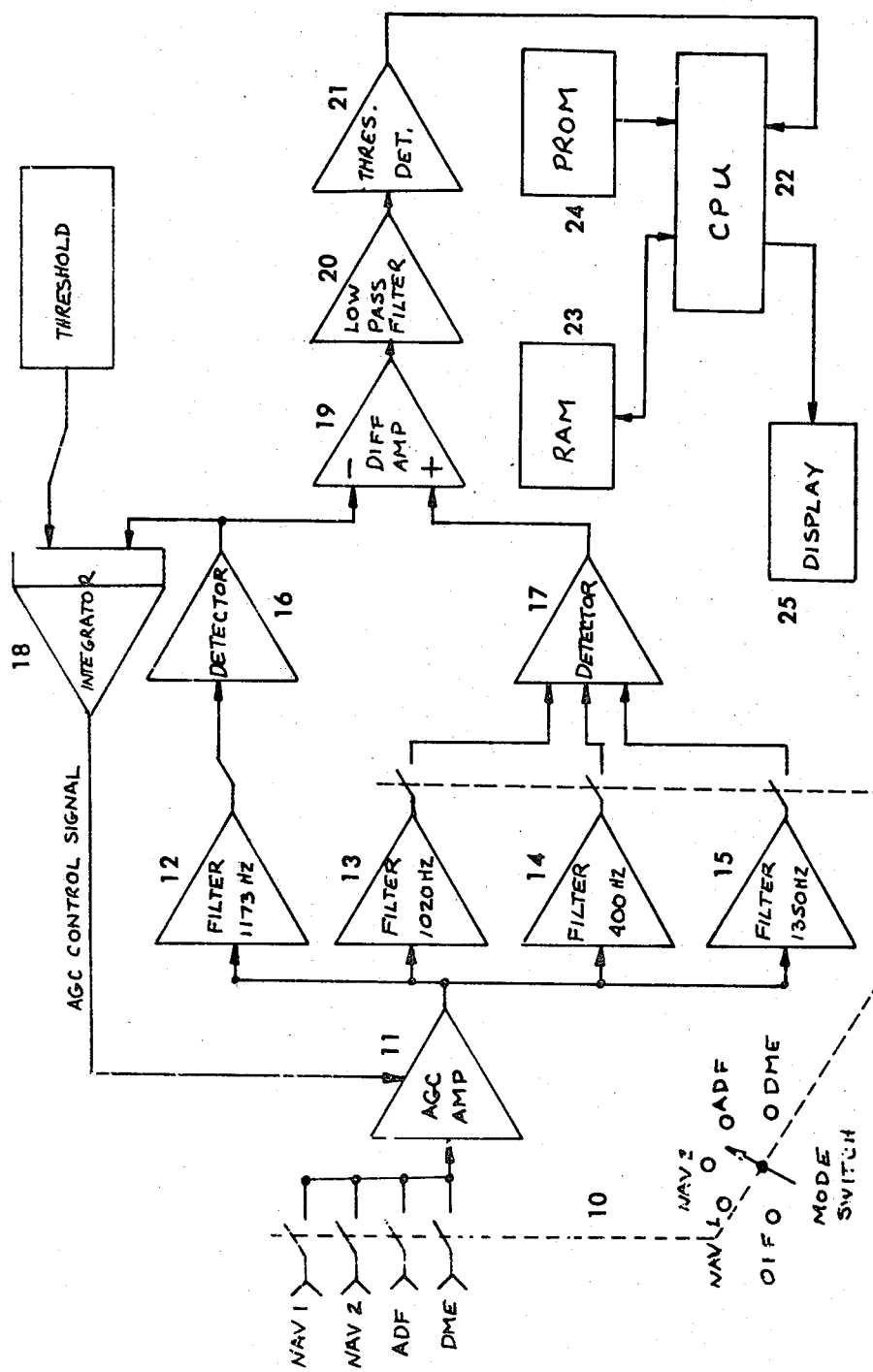
FIG. 1 is a block diagram of an embodiment of the present automatic station identifier and monitor system.

Turning now to the system of FIG. 1, it can be observed from the functional block diagram that the appropriate navigational receivers audio output is selected by means of the mode switch 10. In this case Nav 1 and Nav 2 refer to the number one and number two navigation receivers which include both VOR mode (very high frequency omni range) and LOC mode (Localizer mode used for instrument landing approaches). ADF refers to the automatic direction finding receiver, while DME refers to distance measurement equipment. The selected audio is then applied to an AGC (automatic gain control) amplifier 11, which in turn drives a bandpass filter 12 whose center frequency is set to 1173 Hz. The output of bandpass filter is detected at 16, and finally fed back to the AGC amplifier in the form of a AGC control signal by means of an integrator 18. A center frequency of 1173 Hz is used since it is dadjacent to, but does not coincide with any of the commonly used Morse code tone frequencies. The purpose of this AGC feedback loop is to automatically adjust the front end gain of the instrument to compensate for differences in receiver volume, noise and signal strength. Clearly frequencies other than 1173 Hz could be used to serve this function equally well.

In addition to selecting the desired navigation receiver, the mode switch 10 is also used to select the appropriate bandpass filters 13,14,15 corresponding to the Morse code tone frequency. 1020 Hz is used for VOR and localizer facilities while 1350 hZ is used exclusively by DME stations. Both 1020 Hz and 400 Hz are employed by nondirectional beacon signals which are received by the ADF receiver.

The output of the bandpass filter is at 17 and is subtracted from the detected output of the 1173 Hz filter in a difference amplifier 19. This has the effect of partially subtracting off the background noise since the noise levels in adjacent channels are not independent. For example, a static crash or pop is a source of broadband noise and would appear at the outputs of both the 1173 Hz and 1020 Hz filter and would be nearly cancelled in the difference amplifier 19. The output of the difference amplifier 19 is fed through a low pass filter 20 to a threshold detector 21. The cut off frequency of the lowpass filter 20 is 15 Hz allowing the frequencies associated with the Morse code dots and dashes to pass through with almost no attenuation. The threshold detector 21 converts these dots and dashes to a 0–5 V logic level which serves as the input to the microcomputer where further signal processing is accomplished.

The microcomputer is of conventional design and is comprised of an 8-Bit central processor 22, a one hundred and twenty eight byte random access memory 23 and a 1K byte read only memory 24. There are several important signal processing functions accomplished by the firmware which could be performed by hardware in another embodiment. First, the Morse code dots and dashes are checked to see if they fall within ICAO timing specifications. For example, a pulse of short duration compared to a dot would be rejected as noise. In like manner, a drop out occurring during a key-down period resulting from a similar noise pulse would also be discarded. If it is determined that the two, three or four character identifying Morse code group falls sufficiently close to nominal ICAO timing specifications, the information is immediately displayed on the four character alphanumeric display 25. If the timing of the Morse code dots and dashes deviates by a greater amount from ICAO timing specifications, two identifying code groups out of a series of code groups received must agree before this information is presented to the pilot via the display. This compare feature greatly increases the capability of the instrument to identify stations in the presence of strong background noise while at the same time reducing the possibility of an erroneous identifier to a very low level. The requirement used in the preferred embodiment apparatus that two out of three identifier sequences agree is only one of a number of possibilities. For example, requiring that two successive identifiers agree would be an alternate possibility. In addition if no valid identifier is received within a specified period of time the display automatically reverts to horizontal bars, thus alerting the pilot that the station selected is no longer useable for navigation. The length of time period without valid identifiers required to cause the display to revert to bars is adjusted depending on the type of facility being monitored and varies between 37 seconds for VOR, DME and ADF to 14 seconds for ILS facilities. The basic requirement is to allow sufficient time to receive the code groups. Another embodiment might automatically determine the timing based on the actual facility transmission rate.

Figure 2:
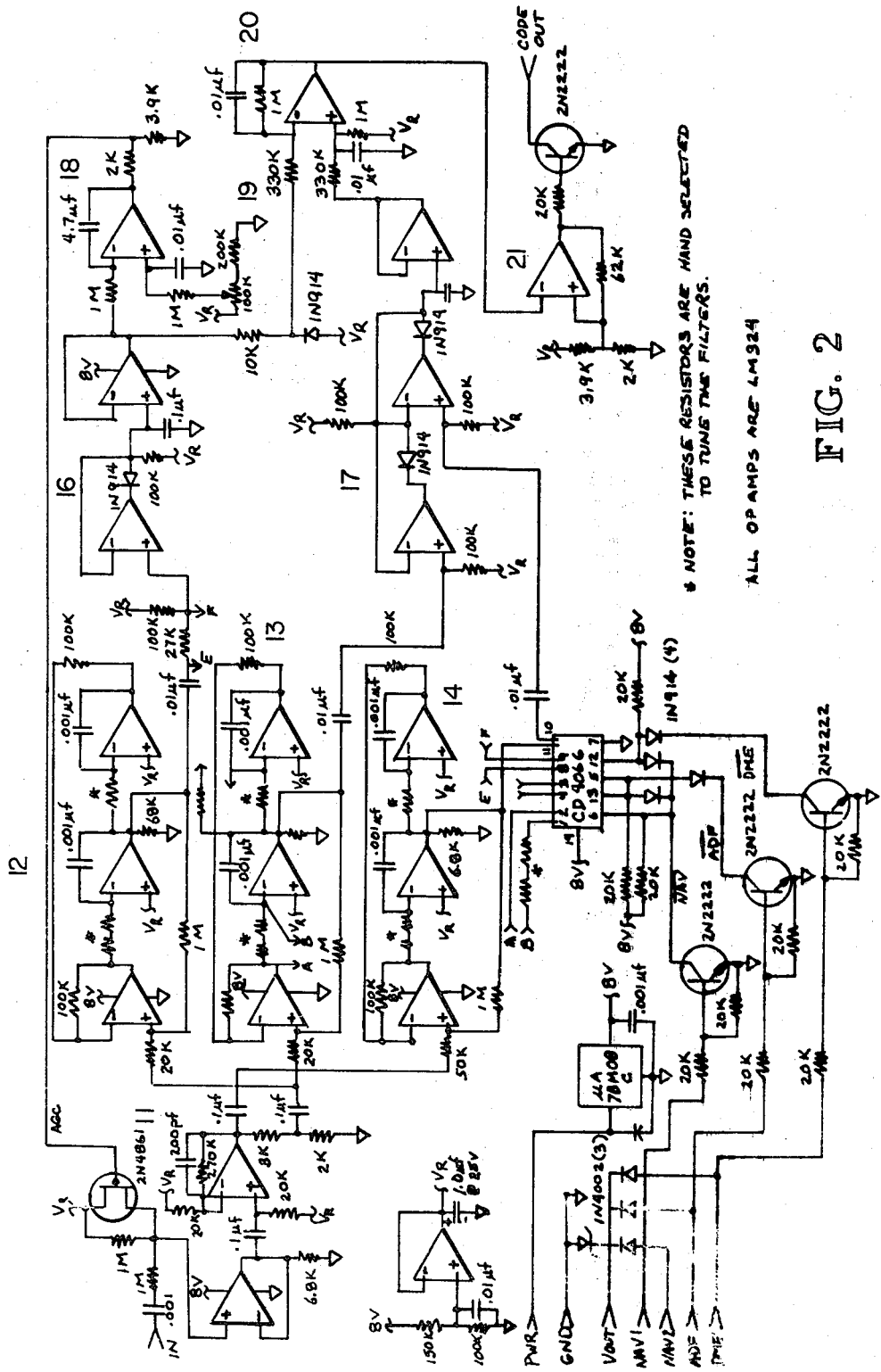
FIG. 2 is a detailed schematic diagram of the analog electronic circuitry.
Figure 3:
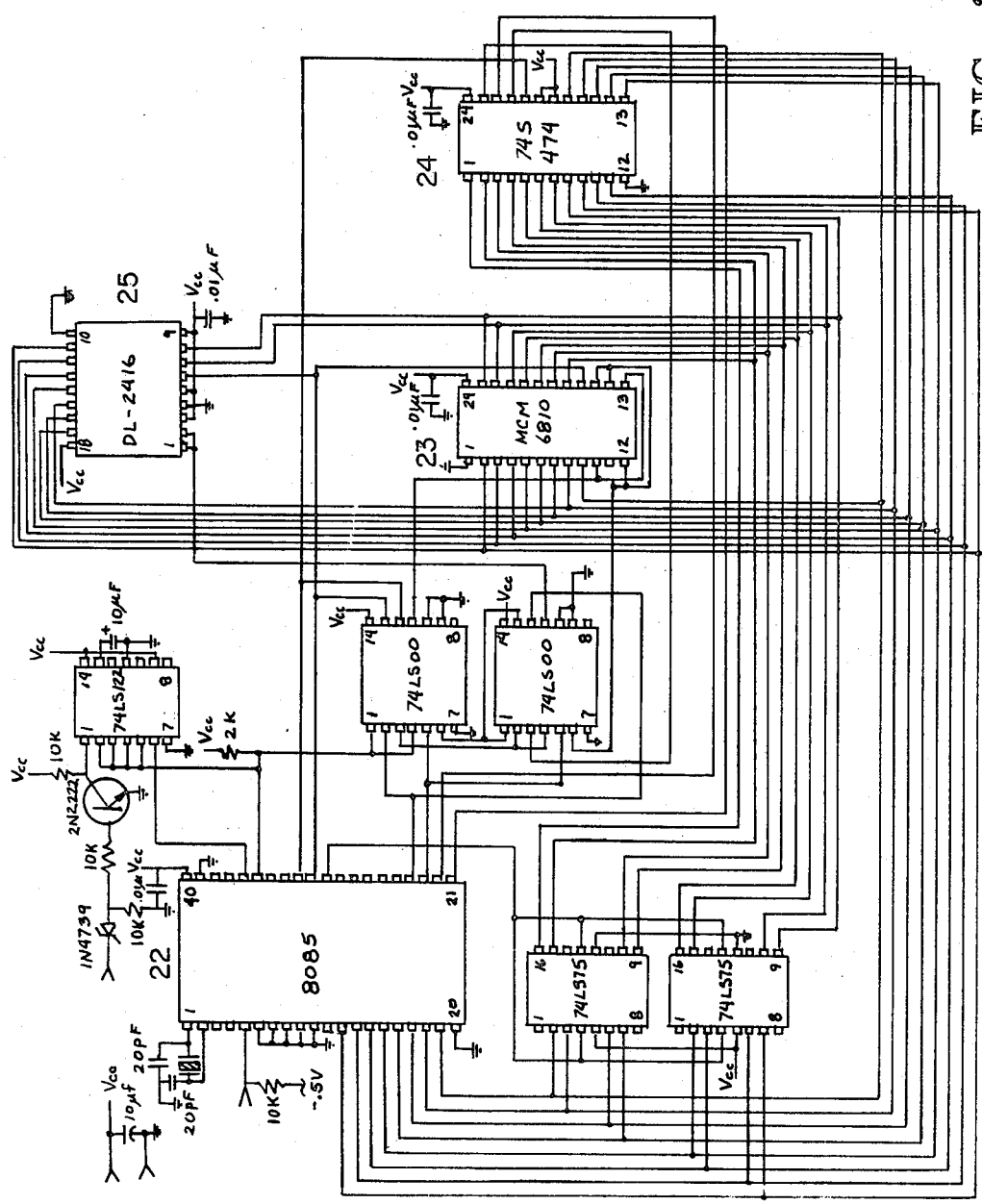
FIG. 3 is a detailed schematic diagram of the digital electronic circuitry.

As previously stated, FIG. 2 is a detailed schematic diagram of the analog electronic circuitry for the illustrated embodiment. This circuitry starts with mode switch 10 and continues to the output of the threshold detector 21. FIG. 3 is a detailed schematic diagram of the digital electronic circuitry. This circuitry starts with the output of the threshold detector 21.

A detailed description of FIGS. 2 and 3 is not necessary because the components in these diagrams are fully identified by the use of conventional symbols and the values of the various electronic components are stated.

The microcomputer circuitry is shown by FIG. 3. The software used can be easily produced by a programmer provided with the criteria disclosed herein, and is per se not a part of the present invention. For this reason, the software is disclosed herein in terms of the function which it is to perform.

The software requirements for the illustrated embodiment of the invention, and some alternative systems as well, have been described above. Summarized, these software requirements are:

1. To check the dots and dashes of the Morse code identifying signal which comes from the lowpass filter to determine if they meet proper timing specification, e.g. ICAO timing specifications.

2. If a pulse is received which is of shorter duration than a true dot by a predetermined amount, the signal is rejected as being noise.

3. If a dropout occurs during a key-down period, resulting from a similar duration noise pulse, it would also be discarded as being noise.

4. If a two, three or four character identifying Morse code group falls sufficiently close to normal ICAO timing specifications, the information is immediately dislayed on a four character alphanumeric display.

5. If the timing of the Morse code dots and dashes deviates by a greater amount from ICAO timing specifications, two identifying code groups out of a series of code groups received must agree before this information is presented to the pilot via the display.

6. Or, as an alternative, two successive identifiers would have to agree before the information is presented to the pilot via the display.

7. If no valid identifier is received within a specified period of time, the display automatically reverts to an alert signal, e.g. horizontal bars, thus alerting the pilot that the station selected is no longer usable for navigation.

8. The length of the time period without valid identifiers required to cause the display to revert to the alert signal is adjusted depending on the type of facility being monitored, the basic requirement being to allow sufficient time to receive the code groups.

9. Alternatively, the timing might be based on the actual facility transmission rate.

Accordingly, it is a principal object of the invention to provide an apparatus for continuous automatic reception, translation and display or electrical output of the Morse code identifiers of radio navigation facilities. It is a further object to provide apparatus of this type which can provide continuous monitoring of the validity of the navigation signal and alert the pilot of a loss of an identifier signal. The apparatus of this invention could be a component of a navigational or flight control system in which the apparatus would continuously identify and monotor navigation stations. Such an apparatus could be used in conjunction with an autopilot or flight control system to verify that only a valid navigational signal is being utilized.

An additional object of the invention is to provide an apparatus of the above type, wherein the output of the device would be a coded sequence which could be used to automatically retrieve data from a stored medium. The data retrieved would contain information relative to the navigation facility being identified by the apparatus. Such information could be used for computing absolute position or other navigational parameters.

The present invention comprises apparatus including circuitry which requires that if the timing of the Morse code dots and dashes conforms within some prescribed tolerance to some standards for the code timing (ICAO standards for example) the information is displayed or communicated to other components or equipment immediately with the reception of the first identifier. The apparatus of the present invention further includes circuitry that requires that two or more identifiers out of a series of transmissions must agree before this information is displayed to other components or equipment. This enables the apparatus to function in the presence of high ambient noise while minimizing the possibility of an erroneous identifier being displayed.

In accordance with an aspect of the invention, the code verification provided by the first circuitry and second circuitry are utilized together. This permits rapid verification of an identifier which conforms within prescribed tolerances to some standard while requiring agreement for identifiers which fall outside the standards or are distorted by noise.

A further object of the invention is to provide apparatus which includes a circuit which senses a noise or signal level in a slice of the signal spectrum outside the Morse code tone frequency. The said circuit provides a control voltage to an automatic gain control circuit, thus enabling the apparatus to function without the need for manual gain adjustments resulting from changes in received volume, ambient noise level, or other intefering sources such as simultaneous voice transmissions.

What is claimed is:

1. A method of electronically identifying a radio station by use of a Morse code identifying signal which is transmitted by the station, comprising:

sensing the noise or signal level in a model signal slice of the radio station signal spectrum which is outside of the Morse code tone frequency and providing a control voltage corresponding to the sensed noise or signal level;

directing both the station signal and the model signal through an automatic gain control amplifier; and using the control voltage to automatically adjust the front end gain to the amplifier to compensate for any differences in receiver volume, noise, and/or signal strength.

2. A method according to claim 1, further comprising subtracting the adjusted model signal from the adjusted radio station signal which includes the Morse code call letters.

3. A method according to claim 2, further comprising converting the signal resulting from the subtraction to digital on-off signals for delivery to a digital computer.

4. A method of electronically identifying a radio station by use of a Morse code signal which is transmitted by the station, comprising:

receiving from a selected radio station, a Morse code signal;

directing such signal to an automatic gain control amplifier;

directing the output of the automatic gain control amplifier to a first bandpass filter which corresponds to the tone frequency of the Morse code signal;

also directing the output from the automatic gain control amplifier to a second bandpass filter which has a center frequency different from the tone frequency of the Morse code signal;

detecting the output of the second bandpass filter and feeding the output signal back to the automatic gain control amplifier in the form of an automatic gain control signal, to automatically adjust front end gain to the amplifier to compensate for any differences in receiver volume, noise, and/or signal strength;

subtracting the output of the first bandpass filter from the output of the second bandpass filter in a difference amplifier;

directing the output of the difference amplifier through a lowpass filter;

utilizing a cut-off frequency in the lowpass filter which will allow frequencies associated with the pulse rate of the Morse code identifying signal to pass through with almost no attenuation; and using the output of the lowpass filter to identify the radio station.

5. A method according to claim 4, wherein the center frequency of the second bypass filter is closely adjacent to, but does not coincide with, the tone frequency of the Morse code.

6. A method according to claim 4, wherein the audio information is in the form of tones.

7. A method according to claim 4, wherein the audio information is navigational information.

8. A method according to claim 4, comprising checking the dots and dashes of the Morse code signal to see if they fall within proper timing specifications, and if so, immediately displaying visual indicia which will identify the radio station.

9. A method according to claim 4, comprising checking the dots and dashes of the Morse code signal to see if they fall within proper timing specifications, and rejecting any pulses of shorter duration than a dot as being noise.

10. A method according to claim 4, comprising checking the dots and dashes of the Morse code identifying signal to see if they fall within proper timing specifications, and if dots and dashes are received which deviate a predetermined amount from the proper timing specifications, continuing to check the timing of additional groups of dots and dashes, and presenting a visual indicia which will identify the radio station in response to a receipt of a predetermined pattern of properly timed dots and dashes within a predetermined plurality of checked Morse code groups.

11. Apparatus for electronically detecting a Morse code signal which is transmitted by a radio station, comprising:

a first bandpass filter which corresponds to the tone frequency of the Morse code signal;

a second bandpass filter which has a center frequency which is different from the tone frequency of the Morse code signal;

means for receiving, from a selected radio station, a Morse code signal;

means for delivering the Morse code identifying signal to both the first and second bandpass filters;

means for subtracting the output of the first bandpass filter from the output of the second bandpass filter to produce an identifier signal; and station identifying means operable in response to an identifier signal to identify the station transmitting the Morse code signal.

12. Apparatus according to claim 11, wherein the center frequency of the second bandpass filter is closely adjacent to, but does not coincide with, the tone frequency of the Morse code signal.

13. Apparatus according to claim 11, further comprising an automatic gain amplifier including means for delivering an output signal from the second bandpass filter back to the automatic gain control amplifier, in the form of an automatic gain control signal, to automatically adjust front end gain to the amplifier to compensate for any differences in receiver volume, noise, and/or signal strength.

14. Apparatus according to claim 11, wherein the station identifying means comprises a lowpass filter which receives the identifier signal, and microprocessor means operable in response to an identifier signal received from the lowpass filter corresponding to a proper timing of dots and dashes to provide a station identifying signal.

15. Apparatus according to claim 14, wherein the microprocessor means includes a threshold detector which converts the dots and dashes received from the lowpass filter into digital on-off signals to serve as the input to the microcomputor.

16. Apparatus according to claim 15, wherein the threshold detector converts the dots and dashes to a 0-5 V logic level.

* * * * *